United States Patent [19]
Omagari

[11] Patent Number: 5,862,464
[45] Date of Patent: Jan. 19, 1999

[54] PIN DIODE VARIABLE ATTENUATOR

[75] Inventor: Shinichi Omagari, Tokyo, Japan

[73] Assignee: NEC Corporation, Armonk, N.Y.

[21] Appl. No.: 788,273

[22] Filed: Jan. 24, 1997

[30] Foreign Application Priority Data

Jan. 30, 1996 [JP] Japan ................................ 8-013827

[51] Int. Cl.$^6$ ................................................ H04B 1/44
[52] U.S. Cl. ...................... 455/280; 455/283; 333/81 R; 333/103
[58] Field of Search .................... 455/78, 80, 82, 455/83, 91, 95, 121, 129, 249.1, 191.1, 191.2, 191.3, 193.1, 193.3, 280, 281, 282, 283; 333/81 R, 81 A, 101, 103

[56] References Cited

U.S. PATENT DOCUMENTS

| | | | |
|---|---|---|---|
| 4,590,417 | 5/1986 | Tanaami et al. | 333/81 R |
| 4,668,882 | 5/1987 | Matsuura | 333/81 R |
| 5,220,679 | 6/1993 | Zametzer et al. | 455/83 |
| 5,748,054 | 5/1998 | Tonegawa et al. | 455/78 |

FOREIGN PATENT DOCUMENTS

| | | |
|---|---|---|
| 57-44314 | 3/1982 | Japan . |
| 60-134615 | 7/1985 | Japan . |
| 60-160716 | 8/1985 | Japan . |
| 62-207016 | 9/1987 | Japan . |
| 3-13111 | 1/1991 | Japan . |
| 3-155210 | 7/1991 | Japan . |

*Primary Examiner*—Thanh Cong Le
*Attorney, Agent, or Firm*—Whitham, Curtis & Whitham

[57] ABSTRACT

It is an object of the present invention to provide a variable attenuator which can be produced at a low cost and can suppress production of unnecessary resonance and propagation. When the radio frequency resistance values of PIN diodes 13 and 14 are higher than a characteristic resistance value of a signal line interconnecting radio frequency signal input terminal 1 and radio frequency signal output terminal 2, the sum of voltages applied to PIN diode 11 and PIN diode 13 and the sum of voltages applied to PIN diode 12 and PIN diode 14, that is, V3, are controlled so as to be fixed. But when the radio frequency resistance values of PIN diodes 13 and 14 are lower than the characteristic resistance value of the signal line, the currents to flow through PIN diodes 13 and 14 are fixed to such values with which the radio frequency resistance values and the characteristic resistance value of the signal line are equal to each other while only the currents to flow through PIN diodes 11 and 12 are controlled to vary the attenuation amount.

4 Claims, 6 Drawing Sheets

PIN DIODE VARIABLE ATTENUATOR

BACKGROUND OF THE INVENTION

1. Field of the Invention

This invention relates to an automatic gain control circuit or the like, and more particularly to a variable attenuator for use in such a high frequency band as a microwave band.

2. Description of the Related Art

Conventionally, variable attenuators have a π-shaped circuit form or a bridged T-shaped circuit form, and both employ PIN diodes at terminations of resistors so that the attenuation amount may be varied by varying the resistance values of the PIN diodes, that is, by varying the voltages applied to the PIN diodes.

Concrete examples of a conventional variable attenuator are described below.

(1) Variable attenuator disclosed in Japanese Patent Laid-Open Application No. Heisei 3-155210.

In the conventional example disclosed, an inverse logarithmic amplifier is used as a control circuit for controlling PIN diodes and in addition the attenuation characteristic with respect to a voltage outputted from the inverse logarithmic amplifier is offset to correct the non-linearity of the attenuation characteristic.

(2) Variable attenuator disclosed in Japanese Patent Laid-Open Application No. Showa 57-44314.

In the conventional example disclosed, a quarter wavelength line is used, and the quarter wavelength line and PIN diodes are connected in parallel to each other so that the attenuation amount is varied by one control current while maintaining a fixed resistance.

However, such conventional variable attenuators as described above have the following problems.

Figure 1A:
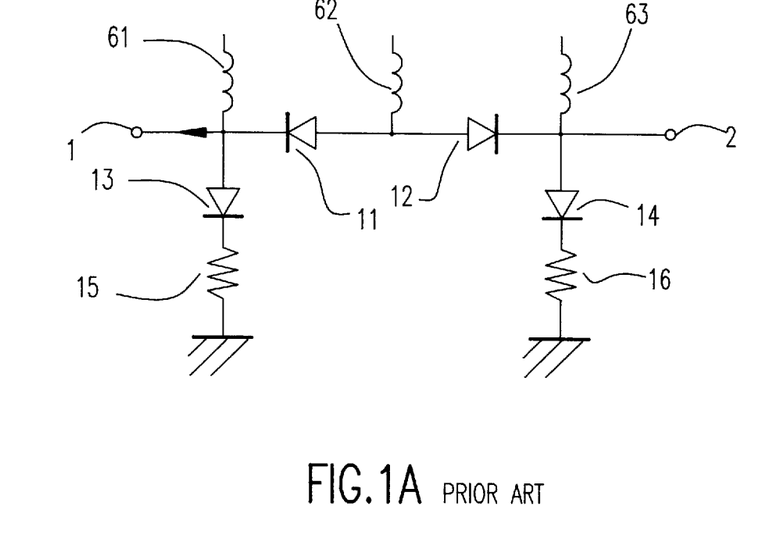
FIG. 1(a) is a circuit diagram showing a radio frequency circuit of the variable attenuator disclosed in Japanese Patent Laid-Open Application No. Heisei 3-155210.
Figure 1B:
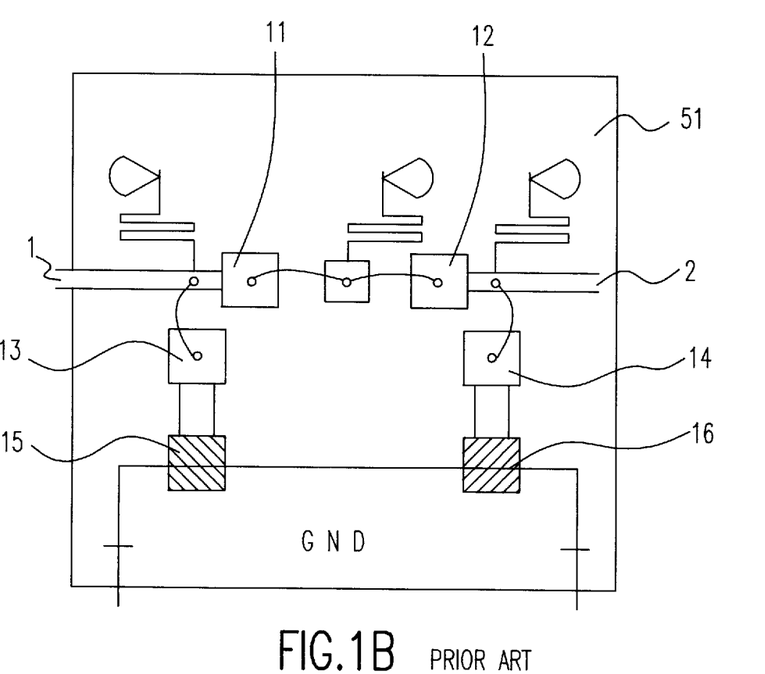
FIG. 1(b) is a schematic view showing an example of mounting of the circuit shown in FIG. 1(a)

FIG. 1(a) is a circuit diagram showing a radio frequency circuit of the variable attenuator disclosed in Japanese Patent Laid-Open Application No. Heisei 3-155210, and FIG. 1(b) is a schematic view showing an example of mounting of the circuit shown in FIG. 1(a).

As shown in FIGS. 1(a) and 1(b), the variable attenuator disclosed in Japanese Patent Laid-Open Application No. Heisei 3-155210 includes a pair of resistors 15 and 16 connected in series between PIN diodes 13 and 14 and the ground, respectively.

Figure 2:
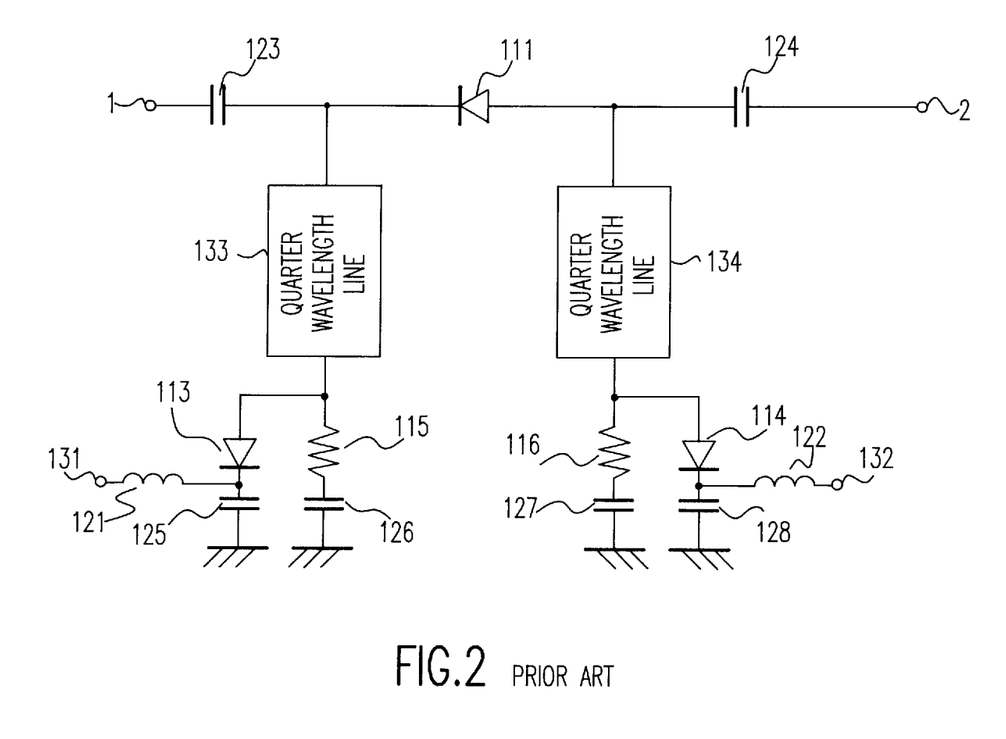
FIG. 2 is a circuit diagram showing a radio frequency circuit of the variable attenuator disclosed in Japanese Patent Laid-Open Application No. Showa 57-44314.

FIG. 2 is a circuit diagram showing a radio frequency circuit of the variable attenuator disclosed in Japanese Patent Laid-Open Application No. Showa 57-44314.

As shown in FIG. 2, the radio frequency circuit of the variable attenuator disclosed in Japanese Patent Laid-Open Application No. Showa 57-44314 includes a pair of quarter wavelength lines 133 and 134, a pair of terminal resistors 115 and 116, and a pair of capacitors 126 and 127 for removing dc components.

Since the conventional variable attenuators have such constructions as described above, they have a problem in that a shield case for accommodating the high frequency circuit has a large size and the isolation is degraded by an unnecessary resonance or propagation mode.

Further, where they are used in a microwave band of a frequency higher than 10 GHz, since ideal parts such as resistors and capacitors are not available, they have a distributed constant characteristic depending upon the parasitic capacitances or the shapes and there is the possibility that the attenuator characteristic may be degraded.

Further, where resistors or like elements are printed on a circuit board using a thin film or thick film technology, there is an additional problem that an increase in cost is invited.

SUMMARY OF THE INVENTION

The present invention has been made in view of such problems of the conventional variable attenuators as described above, and it is an object of the present invention to provide a variable attenuator which can be produced at a low cost and can suppress production of unnecessary resonance or propagation.

In order to attain the object described above, according to the present invention, there is provided a PIN diode variable attenuator, characterized in that it comprises a radio frequency circuit including a radio frequency signal input terminal to which a radio frequency signal is inputted, a radio frequency signal output terminal from which an attenuated radio frequency signal is outputted, first and second PIN diodes connected in series in a signal line interconnecting said radio frequency signal input terminal and said radio frequency signal output terminal, a third PIN diode connected between said radio frequency signal input terminal and the ground, and a fourth PIN diode connected between said radio frequency signal output terminal and the ground, and a bias control circuit for controlling a bias voltage to be applied to said radio frequency circuit, and that said bias control circuit controls, when radio frequency resistance values of said third and fourth PIN diodes are higher than a characteristic resistance value of said signal line, the bias voltage so that a product of currents flowing through said first PIN diode and said third PIN diode and a product of currents flowing through said second PIN diode and said fourth PIN diode may be fixed, but when the radio frequency resistance values of said third and fourth PIN diodes are lower than the characteristic resistance value of said signal line, said bias control circuit controls the bias voltage so as to control currents to flow through said first and second PIN diodes while the currents to flow through said third and fourth PIN diodes are fixed to values with which the radio frequency resistance values and the characteristic resistance value become equal to each other.

The PIN diode variable attenuator is further characterized in that a π-shaped attenuator is formed from said first to fourth PIN diodes.

The PIN diode variable attenuator is further characterized in that said first to fourth PIN diodes are mounted on a straight line.

In the present invention having the construction described above, when the radio frequency resistance values of the third and fourth PIN diodes are higher than the characteristic resistance value of the signal line, the bias control circuit controls the bias voltage so that the product of the currents flowing through the first PIN diode and the third PIN diode and the product of the currents flowing through the second PIN diode and the fourth PIN diode may be fixed to vary the attenuation amount. However, when the radio frequency resistance values of the third and fourth PIN diodes are lower than the characteristic resistance value of the signal line, the bias control circuit controls the bias voltage so as to control currents to flow through the first and second PIN diodes while the currents to flow through the third and fourth PIN diodes are fixed to values with which the radio frequency resistance values and the characteristic resistance value become equal to each other to vary the attenuation amount.

Since the currents to flow through the PIN diodes are controlled to vary the attenuation amount of the output in this manner, the number of parts required for a radio frequency circuit is decreased, and unnecessary resonance or propagation which arises from an increase in size of a shield case or from some other cause is suppressed.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENT

Figure 3:
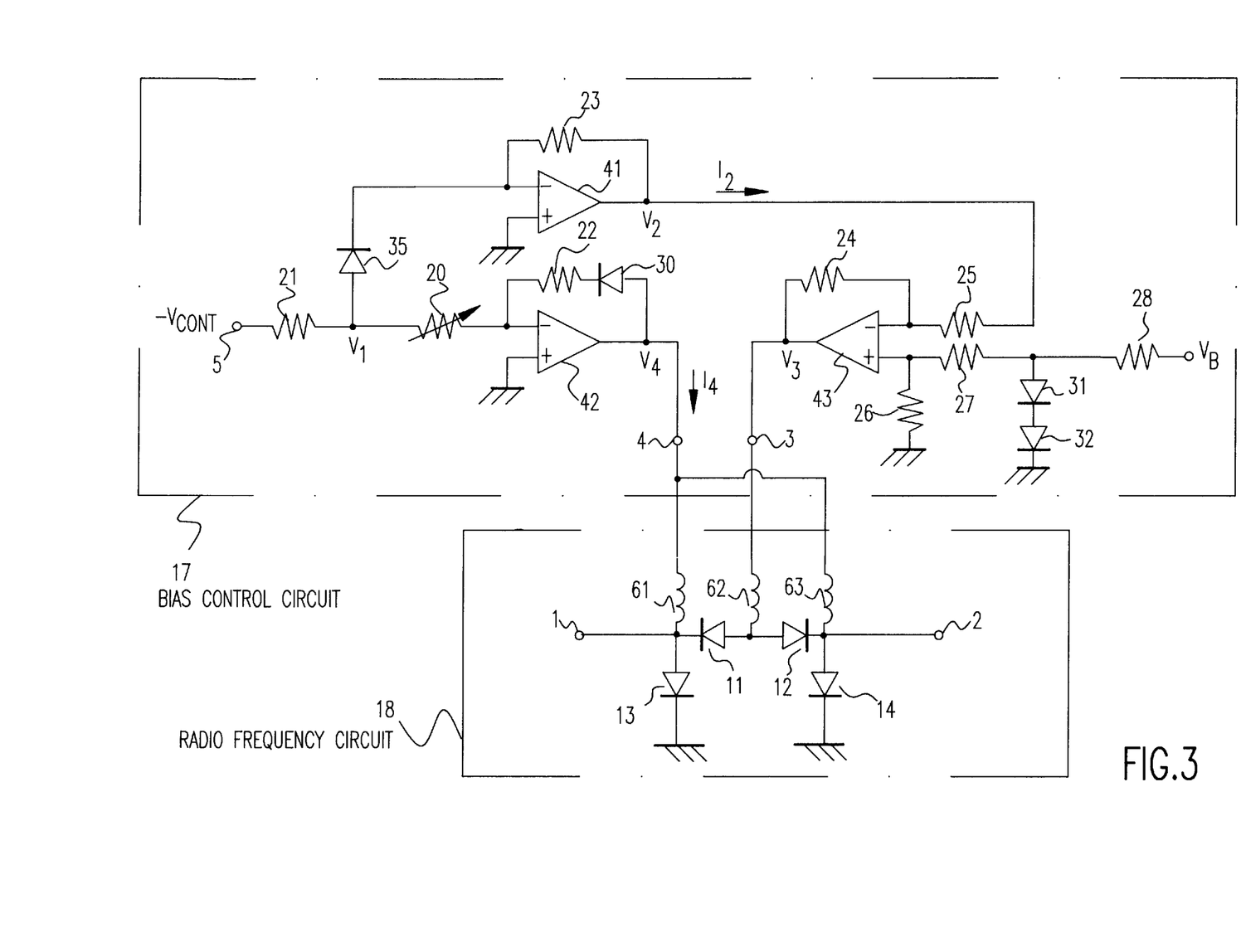
FIG. 3 is a circuit diagram showing an embodiment of a PIN diode variable attenuator of the present invention.

FIG. 3 is a circuit diagram showing an embodiment of a PIN diode variable attenuator of the present invention.

As shown in FIG. 3, the present embodiment includes radio frequency circuit 18 for processing a radio frequency signal, and bias control circuit 17 for controlling a bias voltage to be applied to radio frequency circuit 18. Radio frequency circuit 18 includes radio frequency signal input terminal 1 to which a radio frequency signal is inputted, radio frequency signal output terminal 2 from which a radio frequency signal is outputted, PIN diodes 11 and 12 connected in series in a signal line between radio frequency signal input terminal 1 and radio frequency signal output terminal 2 and serving as a first PIN diode and a second PIN diode, respectively, PIN diode 13 connected between radio frequency signal input terminal 1 and the ground and serving as a third PIN diode, PIN diode 14 connected between radio frequency signal output terminal 2 and the ground and serving as a fourth PIN diode, and three choke coils 61 to 63. Bias control circuit 17 includes control input terminal 5 to which a control voltage is inputted from the outside, bias control terminals 3 and 4 connected to radio frequency circuit 18 for transmitting a control signal to radio frequency circuit 18, operational amplifiers 41 to 43 for controlling voltages to be applied to PIN diodes 11 to 14 in accordance with a control signal inputted thereto from control input terminal 5, eight resistors 21 to 28, variable resistor 20 connected to an input terminal of operational amplifier 42, three diodes 30 to 32, and constant voltage diode 35.

It is to be noted that PIN diodes 11 to 14 are connected so as to form a π-shaped attenuator such that the cathode terminal of PIN diode 11 and the anode terminal of PIN diode 13 are connected to radio frequency signal input terminal 1, the cathode terminal of PIN diode 12 and the anode terminal of PIN diode 14 are connected to radio frequency signal output terminal 2, and the cathode terminals of PIN diodes 13 and 14 are grounded.

Operation of the variable attenuator constructed in such a manner as described above is described below.

A signal inputted through radio frequency signal input terminal 1 is transmitted to radio frequency signal output terminal 2 via PIN diodes 11 and 12.

Figure 4A:
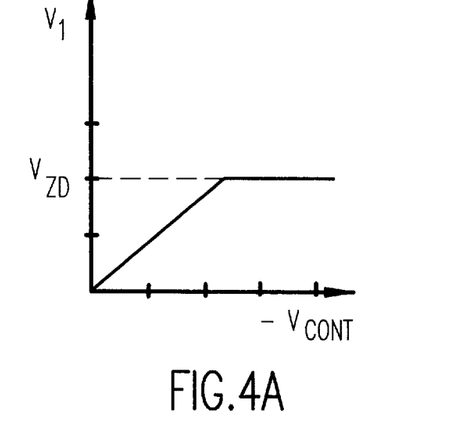
FIG. 4(a) is a graph showing a characteristic of a voltage applied to a variable resistor shown in FIG. 3.
Figure 4B:
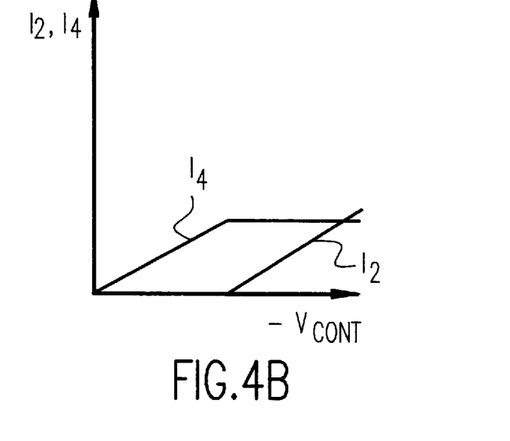
FIG. 4(b) is a graph showing characteristics of currents outputted from operational amplifiers shown in FIG. 3.
Figure 4C:
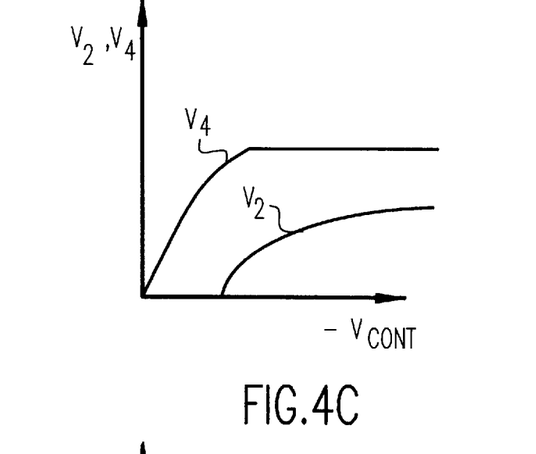
FIG. 4(c) is a graph showing voltage characteristics at output terminals of the operational amplifiers shown in FIG. 3.
Figure 4D:
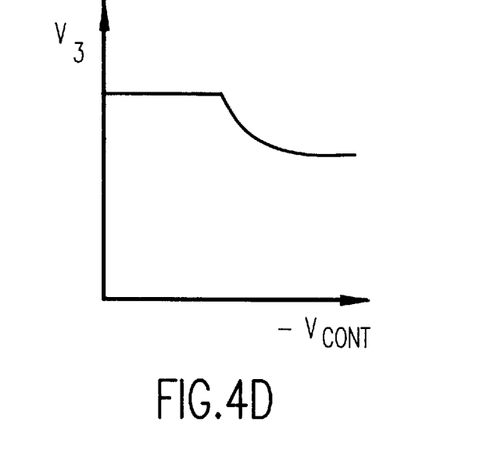
FIG. 4(d) is a graph showing a characteristic of a voltage applied to a bias control terminal shown in FIG. 3.
Figure 4E:
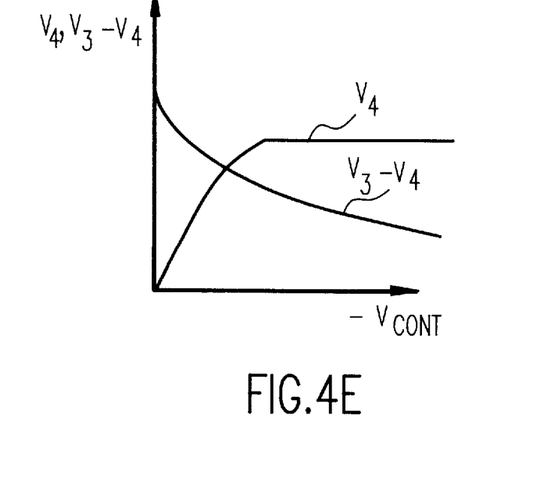
FIG. 4(e) is a graph showing a characteristic of a voltage applied to the bias control terminal shown in FIG. 3 and a characteristic of a voltage applied to one of the PIN diodes shown in FIG. 3.

FIG. 4(a) is a graph showing a characteristic of a voltage applied to variable resistor 20 shown in FIG. 3, FIG. 4(b) is a graph showing characteristics of currents outputted from operational amplifiers 41 and 42 shown in FIG. 3, FIG. 4(c) is a graph showing characteristics of voltages at the output terminals of operational amplifiers 41 and 42 shown in FIG. 3, FIG. 4(d) is a graph showing a characteristic of a voltage applied to bias control terminal 3 shown in FIG. 3, and FIG. 4(e) is a graph showing a characteristic of a voltage applied to bias control terminal 4 and a characteristic of a voltage applied to PIN diode 11 shown in FIG. 3.

When the radio frequency resistance values of PIN diodes 13 and 14 are higher than a characteristic resistance value (in this instance, 50 Ω) of the signal line interconnecting radio frequency signal input terminal I and radio frequency signal output terminal 2, a sum of voltages applied to PIN diode 11 and PIN diode 13 and another sum of voltages applied to PIN diode 12 and PIN diode 14, that is, V3, are controlled so as to be fixed (the current product is fixed).

On the other hand, when the radio frequency resistance values of PIN diodes 13 and 14 are lower than the characteristic resistance value of the signal line, the currents to flow through PIN diodes 13 and 14 are fixed to such values with which the radio frequency resistance values and the characteristic resistance value of the signal line are equal to each other (so as to fix I4) while only the currents (voltages) to flow through PIN diodes 11 and 12 are controlled to vary the attenuation amount.

Here, in the present embodiment, variable resistor 20 is adjusted in advance so that the resistances of PIN diodes 13 and 14 may be fixed at 50 Ω.

Figure 5:
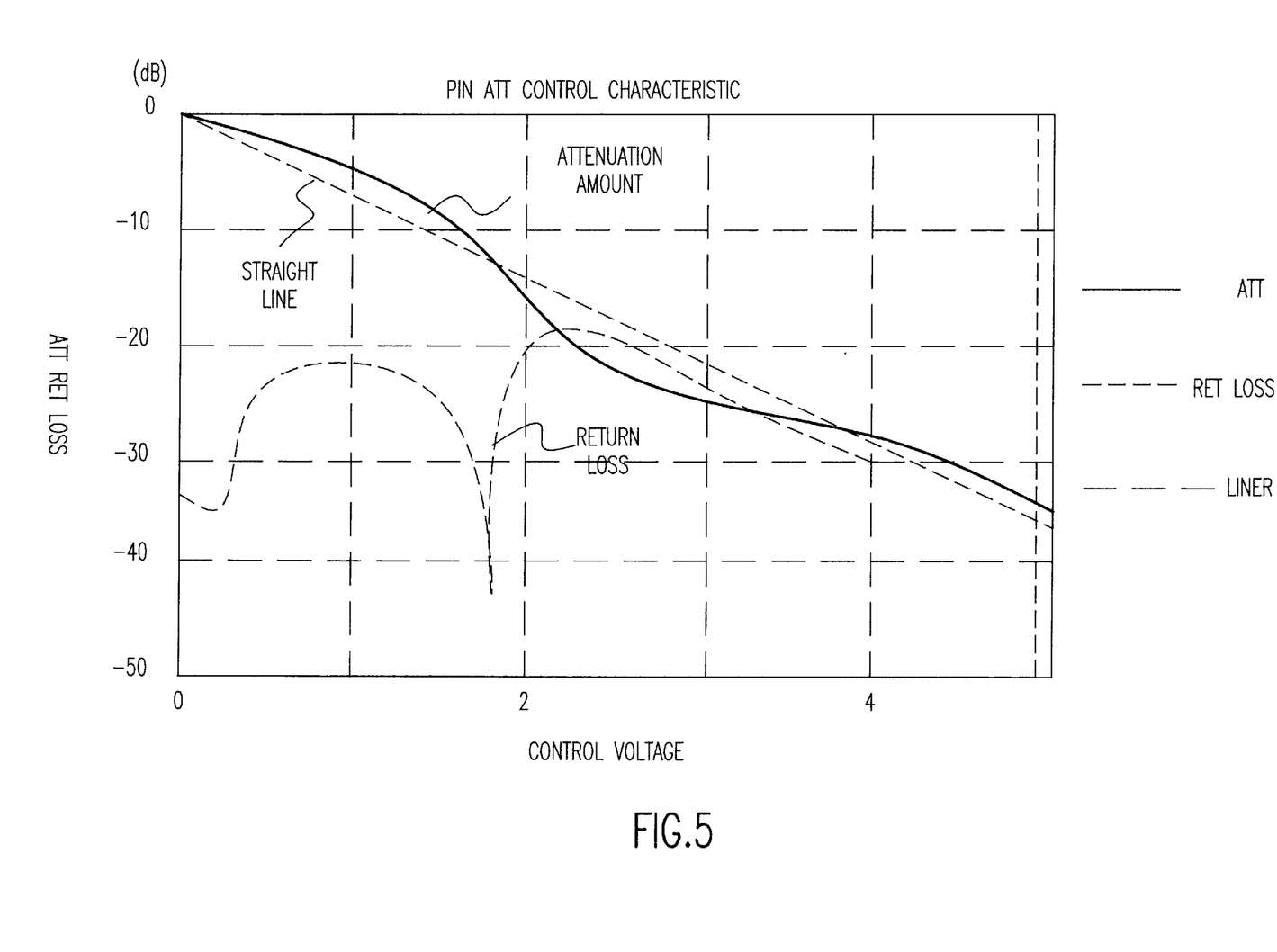
FIG. 5 is a graph showing an attenuation amount and a return loss characteristic of the variable attenuator shown in FIG. 3 with respect to a control voltage.

FIG. 5 is a graph showing an attenuation amount and a return loss characteristic of the variable attenuator shown in FIG. 3 with respect to the control voltage.

As shown in FIG. 5, with the variable attenuator of the present embodiment, a control straight line which exhibits a fixed impedance characteristic wherein the return loss is 20 dB is obtained.

Figure 6A:
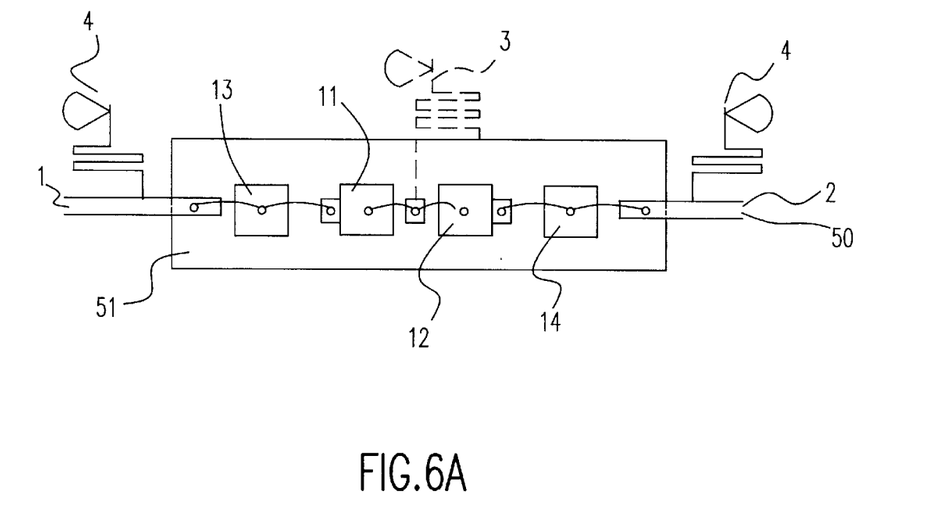
FIG. 6(a) is a top plan view of the variable attenuator shown in FIG. 3 showing a part arrangement of the PIN diodes and wiring lines.
Figure 6B:
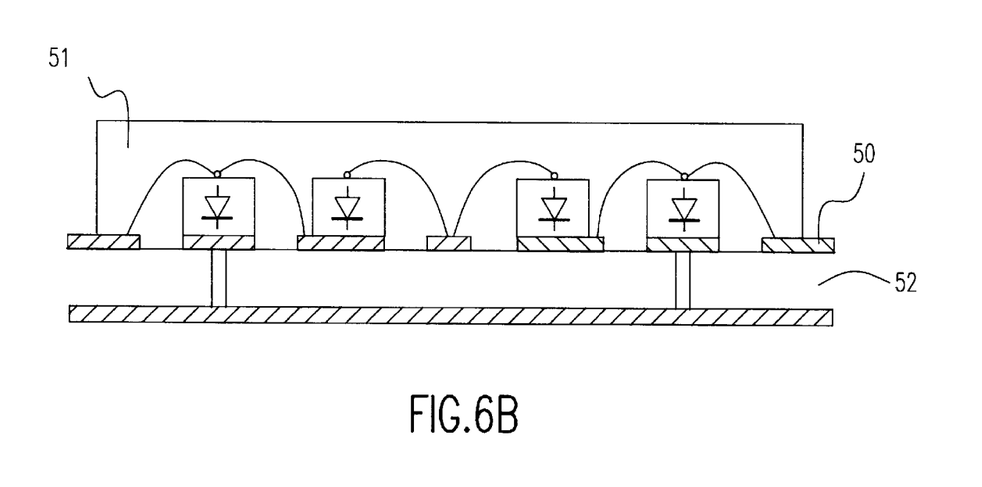
FIG. 6(b) is a side elevational view of the variable attenuator shown in FIG. 3 showing the part arrangement of the PIN diode and the wiring lines.

FIG. 6(a) is a top plan view showing a part arrangement of the PIN diodes and wirings of the variable attenuator shown in FIG. 3, and FIG. 6(b) is a side elevational view showing the part arrangement of the PIN diodes and the wirings of the variable attenuator shown in FIG. 3.

In the present embodiment, as shown in FIGS. 6(a) and 6(b), four PIN diodes 11 to 14 of bare chips are arranged on a straight line, and shield case 51 is provided on the outer side of PIN diodes 11 to 14 in such a manner as to surround PIN diodes 11 to 14.

Due to the construction described above, degradation in isolation which arises from propagation from the input to the output in a waveguide mode can be prevented and a case resonance frequency can be a high frequency, and a variable attenuator having good characteristics can be realized.

Since the present invention has such a construction as described above, the following effects are exhibited.

(1) Since it is constructed such that the attenuation amount is varied by controlling the currents to flow through the individual PIN diodes, the number of parts required in a radio frequency circuit is decreased, and a variable attenuator which is good in radio frequency characteristic can be realized in a small space.

(2) Since the present invention has such a construction that the PIN diodes are grounded directly, thin film (or thick film) resistors are rendered unnecessary, and the cost for a circuit board can be reduced and the width of a shield case can be reduced.

Consequently, production of unnecessary resonance or propagation can be suppressed.

It is to be understood that variations and modifications of PIN Diode Variable Attenuator disclosed herein will be evident to those skilled in the art. It is intended that all such modifications and variations be included within the scope of the appended claims.

What is claimed is:

1. A PIN diode variable attenuator, characterized in that it comprises a radio frequency circuit including a radio frequency signal input terminal to which a radio frequency signal is inputted, a radio frequency signal output terminal from which an attenuated radio frequency signal is outputted, first and second PIN diodes connected in series in a signal line interconnecting said radio frequency signal input terminal and said radio frequency signal output terminal, a third PIN diode connected between said radio frequency signal input terminal and the ground, and a fourth PIN diode connected between said radio frequency signal output terminal and the ground, and a bias control circuit for controlling a bias voltage to be applied to said radio frequency circuit, and that said bias control circuit controls, when radio frequency resistance values of said third and fourth PIN diodes are higher than a characteristic resistance value of said signal line, the bias voltage so that a product of currents flowing through said first PIN diode and said third PIN diode and a product of currents flowing through said second PIN diode and said fourth PIN diode may be fixed, but when the radio frequency resistance values of said third and fourth PIN diodes are lower than the characteristic resistance value of said signal line, said bias control circuit controls the bias voltage so as to control currents to flow through said first and second PIN diodes while the currents to flow through said third and fourth PIN diodes are fixed to values with which the radio frequency resistance values and the characteristic resistance value become equal to each other.

2. A PIN diode variable attenuator according to claim 1 wherein: a π-shaped attenuator is formed from said first to fourth PIN diodes.

3. A PIN diode variable attenuator according to claim 1 wherein: said first to fourth PIN diodes are mounted on a straight line.

4. A PIN diode variable attenuator according to claim 2 wherein: said first to fourth PIN diodes are mounted on a straight line.

* * * * *

UNITED STATES PATENT AND TRADEMARK OFFICE
CERTIFICATE OF CORRECTION

PATENT NO.: 5,862,464
DATED: January 19, 1999
INVENTORS: Shinichi Omagari

It is certified that error appears in the above-identified patent and that said Letters Patent is hereby corrected as shown below.

On the title page, item [73], Assignee section, delete "Armonk, N.Y." and insert --Tokyo, Japan--.

Signed and Sealed this

Fourteenth Day of March, 2000

Attest:

Q. TODD DICKINSON

*Attesting Officer*  *Commissioner of Patents and Trademarks*